United States Patent [19]
Keith

[11] Patent Number: 5,615,020
[45] Date of Patent: Mar. 25, 1997

[54] SYSTEM AND METHOD FOR FAST HUFFMAN DECODING

[76] Inventor: Michael Keith, 17712 SW. Beaver Ct., Beaverton, Oreg. 97006

[21] Appl. No.: 61,584

[22] Filed: May 13, 1993

[51] Int. Cl.$^6$ .............................. H04N 1/41; H03M 7/40
[52] U.S. Cl. ......................... 358/426; 358/427; 382/246; 341/65; 341/67
[58] Field of Search .................................... 358/426, 427, 358/261.1, 261.2, 261.3, 261.4; 382/56, 232, 245, 246; 341/65, 67; 348/384, 390

[56] References Cited

U.S. PATENT DOCUMENTS

| | | |
|---|---|---|
| 3,883,847 | 5/1975 | Frank . |
| 4,369,463 | 1/1983 | Anastassiou . |
| 4,386,416 | 5/1983 | Giltner . |
| 4,396,906 | 8/1983 | Weaver . |
| 4,563,671 | 1/1986 | Lim et al. . |
| 4,574,382 | 3/1986 | Ko . |
| 4,580,162 | 4/1986 | Mori . |
| 4,593,267 | 6/1986 | Kuroda et al. . |
| 4,700,175 | 10/1987 | Bledsoe . |
| 4,706,265 | 11/1987 | Furukawa . |
| 4,813,056 | 3/1989 | Fedele . |
| 4,899,149 | 2/1990 | Kahan . |
| 4,926,266 | 5/1990 | Kurosawa ............................. 358/426 |
| 4,967,196 | 10/1990 | Sprague et al. . |
| 5,045,853 | 9/1991 | Astle et al. . |
| 5,057,917 | 10/1991 | Shalkauser et al. . |
| 5,220,325 | 6/1993 | Ackland et al. . |
| 5,253,053 | 10/1993 | Chu et al. ............................. 348/384 |
| 5,268,769 | 12/1993 | Tsuchiya et al. ...................... 358/427 |
| 5,304,995 | 4/1994 | Dachiku . |
| 5,329,313 | 7/1994 | Keith . |

FOREIGN PATENT DOCUMENTS

| | | |
|---|---|---|
| 0145396 | 6/1985 | European Pat. Off. . |
| 0577330 | 1/1994 | European Pat. Off. . |
| 59-152780 | 8/1984 | Japan .................................... 358/427 |
| WO8905556 | 6/1989 | WIPO . |

OTHER PUBLICATIONS

"DVI Image Compression—Second Generation," by Stuart J. Golin, Image Processing Algorithms and Techniques III, SPIE vol. 1657, Proceedings of the International Society for Optical Engineering, 1992, pp. 106–113.

Abramson, N., "Information Theory and Coding," McGraw–Hill 1963, pp. 77–92.

"The i750 Video Processor: A Total Multimedia Solution," Communications of the ACM, vol. 34, No. 4, Apr. 1991, New York, pp. 64–78.

Patent Abstracts of Japan, vol. 11, No. 83, (E–489) (2530), Mar. 13, 1987, entitled "Data Processing Method" and JP,A61237520 (Canon, Inc.) 22 oct. 1986.

Patent Abstracts of Japan, vol. 15, No. 018 (E–1023), 16 Jan. 1991 and JP-A-02 265329, Canon, Inc., 30 Oct. 1990. Abstract.

European Search Report completed Jan. 5, 1996 in re Application No. EP 94 10 7378.

*Primary Examiner*—Thomas D. Lee
*Attorney, Agent, or Firm*—William H. Murray

[57] ABSTRACT

A method is provided for performing statistical decoding if a symbol in a data stream having byte boundaries wherein the symbol may have varying alignments with respect to the byte boundaries. The next byte of data is fetched from the data stream wherein the fetched byte contains at least a portion of the symbol. Based on this byte and on the current bit position, which is maintained by a state machine, either (a) a decoded value is obtained from a lookup table, or (b) further bytes are fetched and used to determine the decoded value. Each symbol has a prefix and free bits wherein the entire symbol may be included in the next byte, a boundary of the next byte may fall within a prefix, or a boundary of the next byte may fall within the free bits depending on the alignment of the symbol. Differing action routines, corresponding to differing symbols, may be selected for execution according to the decoded values determined in the symbols.

9 Claims, 5 Drawing Sheets

5,615,020

SYSTEM AND METHOD FOR FAST HUFFMAN DECODING

BACKGROUND OF THE INVENTION

1. Field of the Invention

This invention relates to the field of signal processing and in particular to decompression of statistically encoded digital signals.

2. Background Art Statement

Huffman encoding of numerical data, or more broadly variable bit length encoding of numerical data, is an important part of many data compression algorithms in the field of video processing. Huffman encoding is effective to compress numerical data by taking advantage of the fact that most data sets contain non-uniform probability distributions of data values. When using the Huffman method the data values are encoded using codes of different bit lengths. The more frequently occurring data values are assigned shorter codes and the less frequently occurring data values are assigned longer codes. Thus, the average code length for the data values in the data set is minimized. For typically skewed probability distributions of data values the use of Huffman encoding may achieve a compression factor of between one and one-half and two times.

Many important Compression algorithms do involve Huffman decoding, however, and the decoding of such algorithms on general purpose processors is becoming increasingly widespread. The reason that a fast algorithm for Huffman decoding is required is that conventional algorithms for decoding Huffman data are too slow. The conventional algorithms for decoding a Huffman symbol require traversing a binary tree using successive individual bits from the compressed data bit stream at each node of the tree. When a terminal node of the binary tree is reached, the traversal is complete and the decoded value of the Huffman symbol is determined from a table.

At best, this tree traversal decoding algorithm requires five instructions per bit of the encoded symbol on conventional video processors. In many applications Huffman symbols tend to average about four bits each. Thus, approximately twenty instructions or about eighty cycles per symbol are required on a conventional video processor. At approximately three hundred thousand symbols per second, a typical symbol rate for thirty frame per second video displays, this results in twenty-four megahertz. A bit-by-bit method such as this thus requires most of the available cycles on a conventional twenty-five megahertz video processor. Even on a more powerful video processor, a large fraction of the available cycles are required to execute this type of bit-by-bit algorithm. This is not acceptable because Huffman decoding is typically only a small part of the total amount of work required in a video processing system.

In order to perform Huffman processing quickly, it would be advantageous to avoid processing one bit of the bit stream at a time and decode each Huffman symbol as a whole.

It is also desirable in performing Huffman processing to avoid the requirement of accessing the bit stream on non-byte boundaries because this type of accessing involves expensive bit manipulation. However, it is difficult to avoid accessing on non-byte boundaries because the Huffman codes in the bit stream are packed together without regard to byte boundaries.

SUMMARY OF THE INVENTION

A method is provided for performing statistical decoding if a symbol in a data stream having byte boundaries wherein the symbol may have varying alignments with respect to the byte boundaries. The next byte of data is fetched from the data stream wherein the fetched byte contains at least a portion of the symbol. Based on this byte and on the current bit position, which is maintained by a state machine, either (a) a decoded value is obtained from a lookup table, or (b) further bytes are fetched and used to determine the decoded value. Each symbol has a prefix and free bits wherein the entire symbol may be included in the next byte, a boundary of the next byte may fall within a prefix, or a boundary of the next byte may fall within the free bits depending on the alignment of the symbol. Differing action routines, corresponding to differing symbols, may be selected for execution according to the decoded values determined in the symbols.

DETAILED DESCRIPTION OF THE INVENTION

Figure 1A:
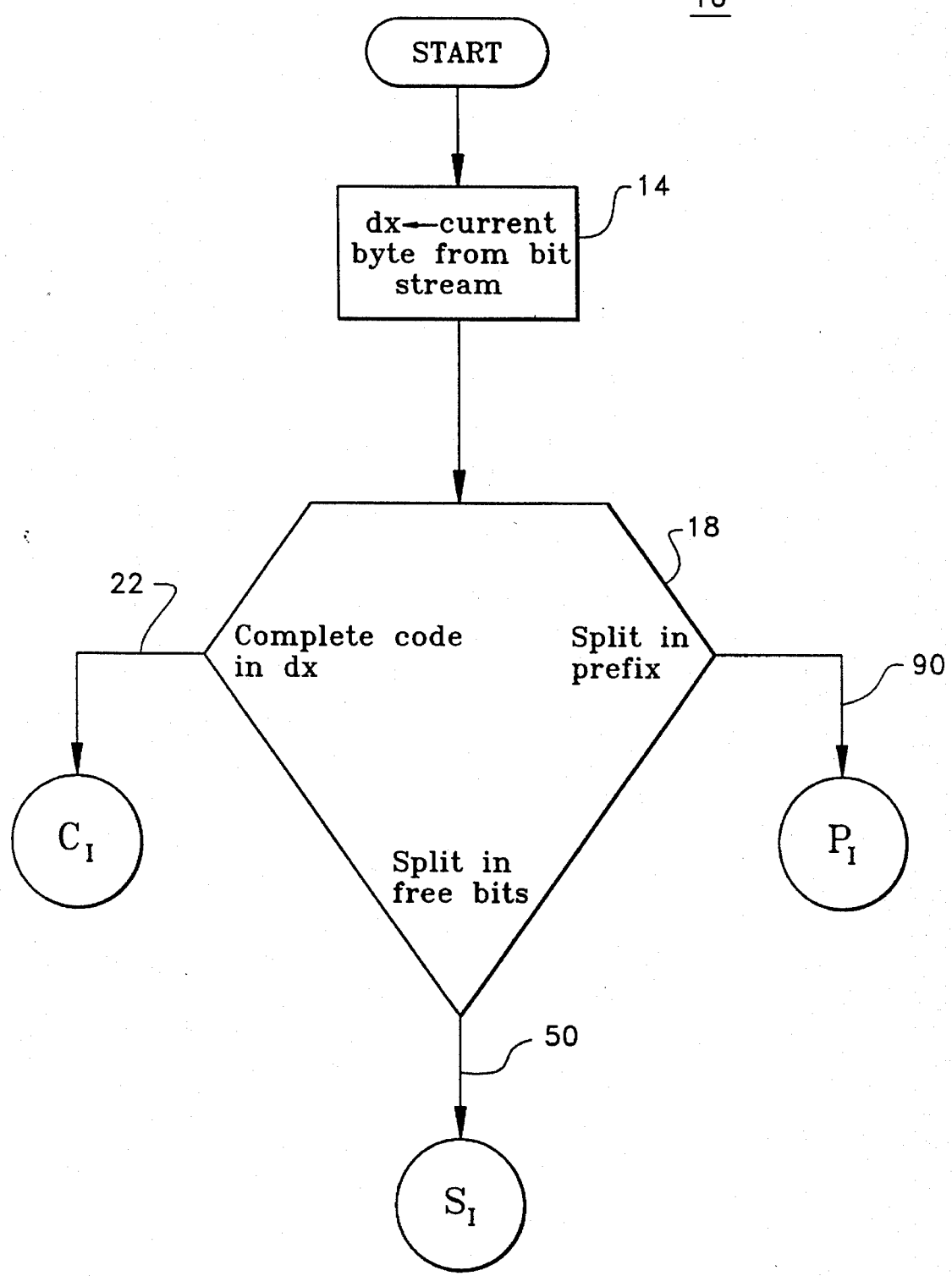
FIGS. 1A–D show a flow chart representation of the fast statistical decoding method of the present invention.
Figure 1B:
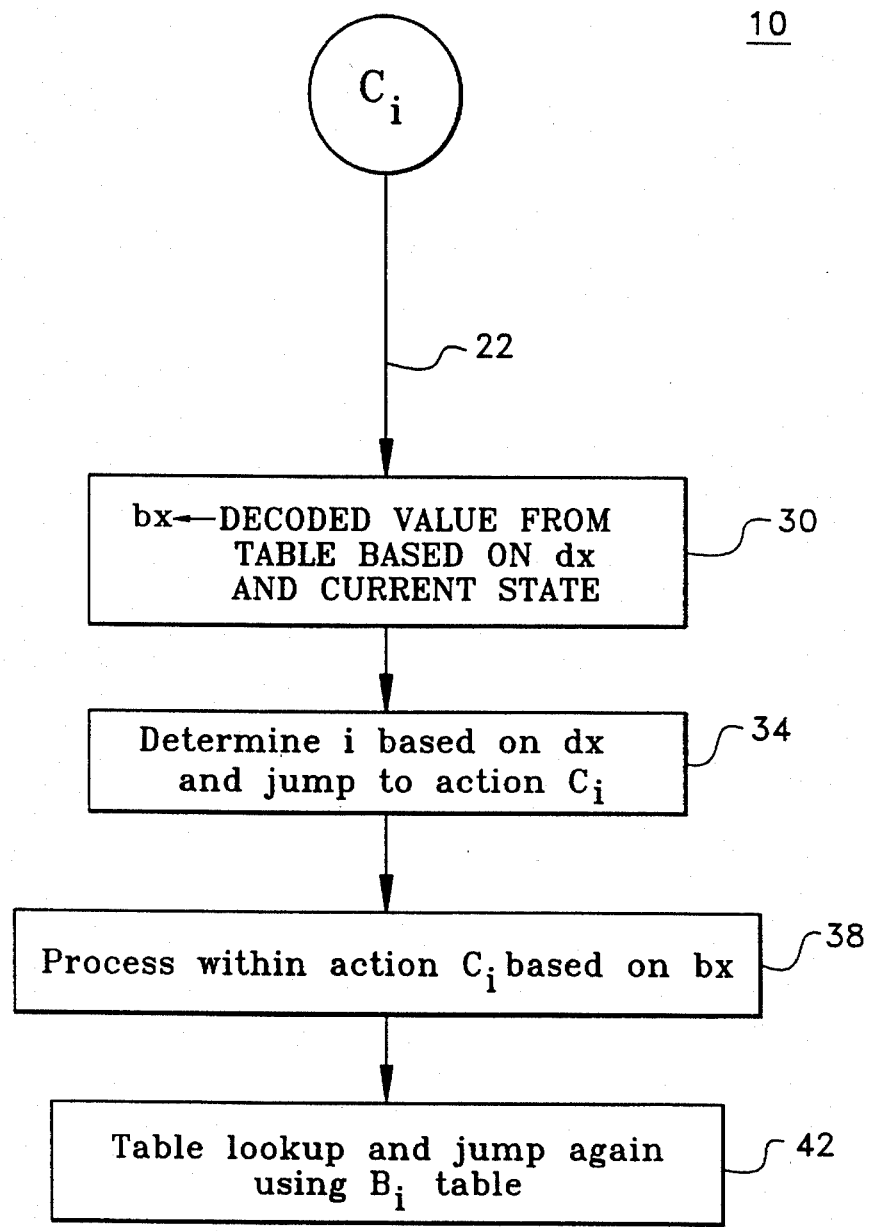
Figure 1C:
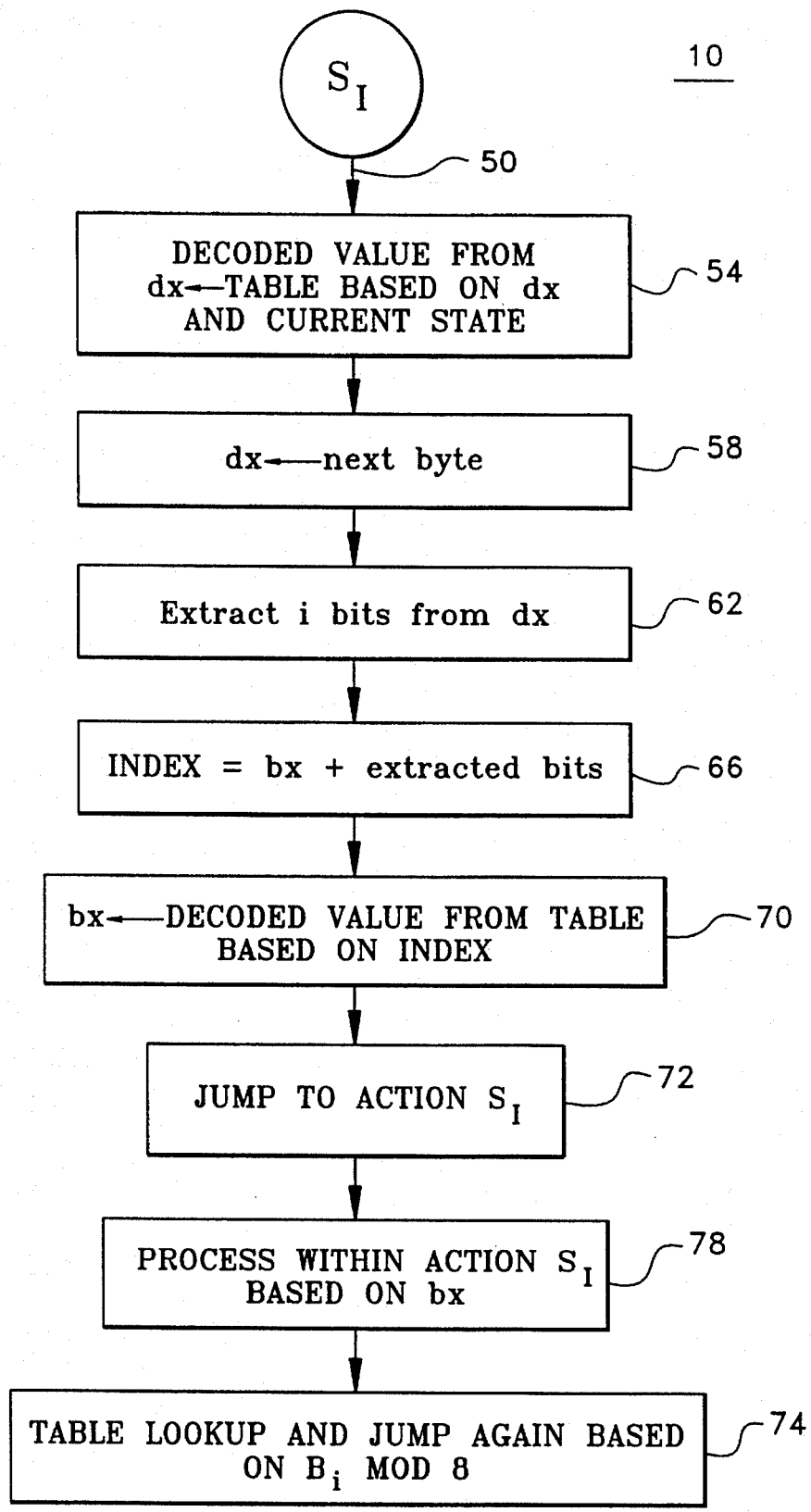
Figure 1D:
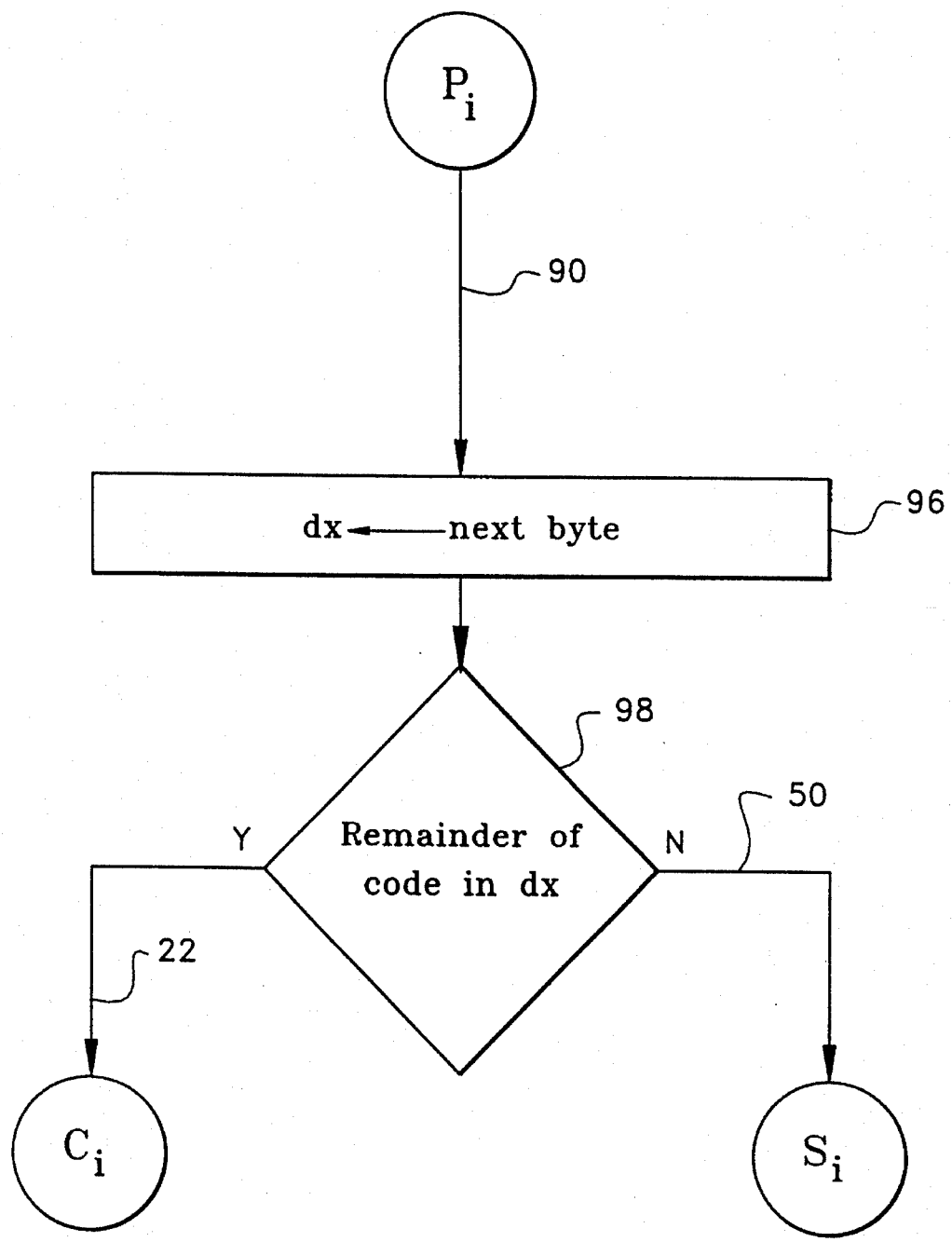

Referring now to FIGS. 1A–D, there is shown a flow chart representation of fast statistical decoding method 10 of the present invention. Statistical decoding method 10 for determining Huffman code book format is applicable to arbitrary Huffman code books and, more broadly, to code books of any type of statistical code. However, it is useful to describe statistical deciding method 10 in terms of Huffman code books and, in particular in terms of Huffman code books which satisfy a few restrictions. It will be understood that other Huffman code books not meeting these restrictions may also be processed using statistical decoding method 10 with minor adaptations and some additional table storage.

It will be understood that an arbitrary Huffman code book consists of a set of Huffman binary bit streams, $\{H_i\}$. Each bit stream $H_i$ of a Huffman code book has a unique decoded value $V_i$. It is not necessary that the decoded values $V_i$ be the integers 0, 1, 2, . . . in a predetermined order. The more general case is permitted wherein each Huffman bit stream $H_i$ may be mapped onto an index, $I_i$, which is one of the integers $\{0, 1, 2, \ldots\}$, and each $I_i$ is mapped by another one-to-one function into the final decoded value $V_i$. In some applications statistical decoding method 10 of the present invention may proceed directly from a bit stream $H_i$ to the decoded values $V_i$, while in the prior art methods a two step mapping, $H_i \rightarrow I_i \rightarrow V_i$, was required.

In general Huffman code books may be described in the form described below. This is crucial to statistical decoding method 10 of the present invention. The first step in decoding method 10 is assigning rows to all code words in the code book, wherein table $T_i$ is provided with R rows. The Huffman bit stream $H_i$ in row k of table $T_i$ consists of some number, P(k), of leading symbol prefix bits P followed by some number, F(k), of free bits x. By definition the bit streams constructed by replacing the free bits x with all binary strings of length F(k) are valid code words. Note that some of the R rows of table $T_i$ may have zero free bits x. However, each row R must have at least one symbol prefix bit P. An example of a table $T_i$ meeting these restrictions is shown in Table I.

TABLE I

```
0xx
10xxx
110xxx
1110xxxx
11110xxxx
111110xxxxxx
1111110xxxxxx
```

In the symbology of Table I the zero bits and the one bits in each row R represent the prefix of the Huffman symbol and the trailing x's represent the free bits of the symbol. Another example of a table $T_i$ meeting these restrictions is shown in Table II. In the symbology of Table II the zero bits, the one bits and the trailing x's represent the Huffman symbol as previously described with respect to Table I.

TABLE II

```
10
11x
011x
010xx
000001
00101X
0011xx
0001xxx
00001xxx
00100xxxx
0000001xxxx
00000001xxxxx
00000000xxxxxx
```

For the simplest embodiment of statistical decoding method 10, each row R of Huffman table $T_i$ must satisfy the restrictions of Equation (1) and Equation (2):

$P(k) \leq 8$      Equation (1)

$F(k) \leq 8$.      Equation (2)

Note that the restrictions of Equation (1) and Equation (2) are satisfied by the examples of the code books set forth in both Table I and Table II. The restriction of Equation (1) is the more likely of the two restrictions to be violated for many Huffman bit streams $H_i$. It will be understood that codebooks not satisfying Equation (1) or (2) can also be processed by this method, with some slight modifications.

Figure 2:
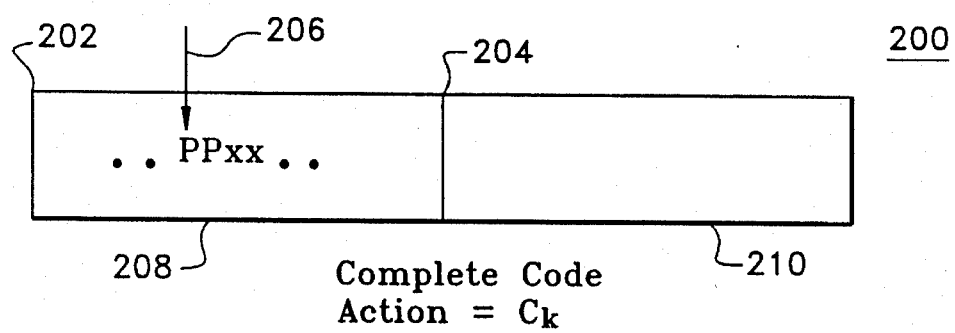
FIG. 2 shows a symbol alignment diagram representative of a complete code type of alignment for a statistical symbol with respect to the byte boundaries of a compressed bit stream being decoded by the method of FIG. 1.
Figure 3:
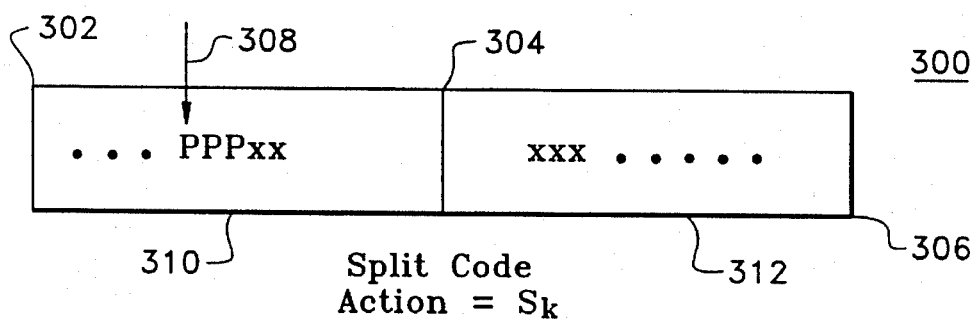
FIG. 3 shows a symbol alignment diagram representative of a split code type of alignment for a statistical symbol with respect to the byte boundaries of a compressed bit stream being decoded by the method of FIG. 1.
Figure 4:
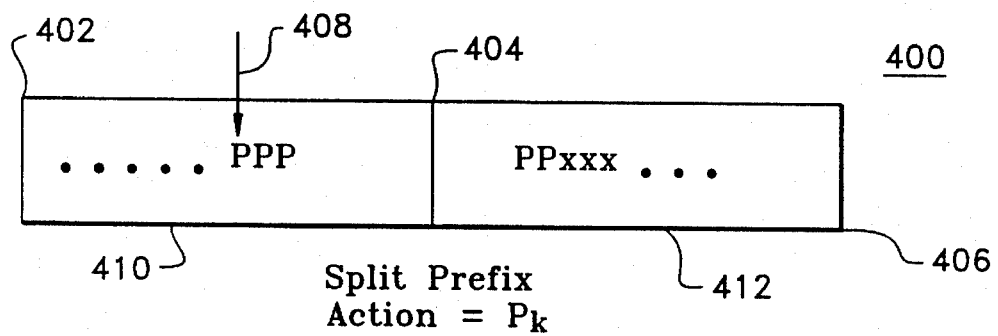
FIG. 4 shows a symbol alignment diagram representative of a split prefix type of alignment for a statistical symbol with respect to the byte boundaries of a compressed bit stream being decoded by the method of FIG. 1.
Figure 5:
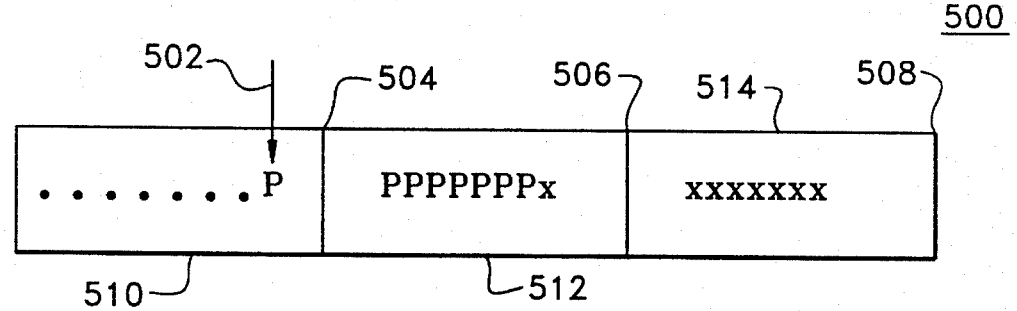
FIG. 5 shows a symbol alignment diagram representative of a further possible alignment of a statistical symbol with respect to the byte boundaries of a compressed bit stream being decoded by the method of FIG. 1.

Referring now to FIGS. 2–5, there are shown Huffman symbol alignment diagrams 200, 300, 400, 500. Symbol alignment diagrams 200, 300, 400 are representative of three relationships which may exist between the various byte boundaries in a bit stream $H_i$ and the code words or symbols to be decoded by fast statistical decoding method 10. It will be understood that only the three different types of alignment which are shown in symbol alignment diagrams 200, 300, 400 may occur with respect to decoding the next Huffman string. A decision which of these three alignments is occurring is made in alignment decision 18 of statistical decoding method 10 after the current byte is read and stored in a register as shown in read block 14.

In Huffman symbol alignment diagrams 200, 300, 400, 500 the P's represent the prefix of the next Huffman string to be read and decoded. The first P of each alignment diagram 200, 300, 400, 500 represents the position of a respective bit-aligned pointer.206, 308, 408, 502. Because bit-aligned pointers 206, 308, 408, 502 are, by definition, positioned at the beginning of a new Huffman symbol the new symbol begins at bit position i.

One embodiment of fast statistical decoding method 10 of the present invention may be a byte-driven state machine of the type which is well known to those skilled in the art. Such a state machine embodiment is ultimately based upon the ability of a processor system to execute an indirect jump or a computed go-to. In order to avoid complicated shifting and in order to speed processing, data shown in symbol alignment diagrams 200, 300, 400 may be fetched from a compressed bit stream one byte at a time for processing by fast statistical decoding method 10. A current byte such as current bytes 208, 310, 410 from the compressed bit stream may be stored in a register, which may be called, for example, register dx. A state machine is used to keep track of the current bit position. The eight states are denoted by, $B_0, B_1, \ldots B_7$. State $B_i$ of the state machine may be understood to indicate that a bit-aligned pointer is positioned at bit number i of the current byte in register dx, at the beginning of the next Huffman symbol to be decoded.

The symbol alignment represented by Huffman symbol alignment diagram 200 is the simplest of the three possibilities within a compressed bit stream being decoded. In symbol alignment diagram 200 the entire next Huffman symbol is entirely contained within current byte 208 having byte boundaries 202, 204. Therefore, no bits of the next Huffman symbol reside in next byte 210 of symbol alignment diagram 200. When alignment decision 18 determines this alignment has occurred execution of statistical decoding method 10 proceeds by way of path 22.

In this case Huffman decoding in accordance with statistical decoding method 10 may be performed with only two instructions. The first instruction performs a table lookup based upon current byte 208, stored in register dx, and upon the current state of the state machine as shown in lookup block 30. This table lookup provides a decoded value $V_i$ which is stored in a decoded value register. The decoded value register may be designated bx as also shown in block 30. The second instruction is a JMP indirect from a table based upon current byte 202 and the current state stored in register dx as shown in jump block 34. This JMP transfers execution to one of eight different routines, or actions, within statistical decoding method 10 where processing is performed according to bx as shown in block 38. These eight actions are designated $C_0, C_1, \ldots C_7$. A table lookup and a jump are then performed again using table $B_i$ as shown in block 42.

The code for actions $C_i$ which read Huffman codes which are aligned as shown in symbol alignment diagram 200 is:

---

$C_i$:

[do whatever additional processing is required, using the decoded value in bx]
do the table lookup and indirect JMP again, using the tables for state $B_i$.

---

Note that action number i is the same as the next state number. This number i of action $C_i$ is the current state number plus the length of the decoded symbol. Thus bit pointer 206 is advanced by the number of bits in the symbol just decoded.

In order to practice statistical decoding method 10, the required data tables and jump tables may be provided with the correct table entries beforehand. This may be performed by an offline algorithm that determines all possible byte values in all possible states and stores the appropriate actions and values in the data tables and the jump tables. The determinations by the offline algorithms may be made unambiguously for the $C_i$ actions.

In the description of fast statistical decoding method 10 thus far, there is a total of eight states $C_0 \ldots C_7$ which may be entered by way of jump block 34. Each of these eight states $C_i$ requires a two hundred and fifty-six entry jump table wherein each jump table requires five hundred and twelve bytes of storage space. Each state $C_i$ also requires a two hundred and fifty-six byte value table of the sample size. Thus a total of approximately six kilobytes of table space may be required for all eight states $C_i$ which may be represented generally by Huffman symbol alignment diagram 200.

The case represented by Huffman symbol alignment diagram 300 is the split code case. This case represents a second way in which a Huffman symbol may be aligned with respect to the byte boundaries in a compressed bit stream being decoded. In the split code case the next Huffman symbol to be decoded does not fit entirely within current byte 310 having byte boundaries 302, 304. Byte boundary 304 falls within the next symbol and a portion of the next symbol resides in next byte 312 having byte boundaries 304, 306. When alignment decision 18 determines that the symbol is aligned in this manner execution of statistical decoding method 10 proceeds from alignment decision 18 by way of path 50.

In the case represented by symbol alignment diagram 300 the Huffman symbol is split by byte boundary 304 within the free bits section. This free bits section of the symbol is represented by the sequence of x's extending from current byte 310 to next byte 312. This is to be distinguished from cases in which a byte boundary falls within the prefix of a Huffman symbol in a compressed bit stream being decoded according to decoding method 10.

In the split code case it is still possible for statistical decoding method 10 to determine which action to take based entirely upon the value within current byte 310. Because the symbol prefix, indicated by the series of P's in current byte 310, is completely contained within current byte 310, it is known which row R of the Huffman table $T_i$ is being used. Therefore the number of free bits x within the total Huffman symbol being decoded is also known. From this the number of free bits x in next byte 312 may be determined.

Thus it is possible to complete the decoding of this Huffman symbol by storing a decoded value which is obtained from the table based on dx and the current state into register bx as shown in block 54 and reading next byte 312 into register dx as shown in block 58. A known number of leading bits are extracted from next byte 312 as shown in block 62 and the bits extracted from next byte 312 are added to the base value read from the data table to form an index as shown in block 66. Thus, this process provides an index $I_i$ rather than a decoded value $V_i$ within statistical decoding method 10. Therefore it is still necessary to perform a translation to get the final decoded value $V_i$ from the index $I_i$. When the decoded value $V_i$ is obtained by this process it is stored in register bx as shown in block 70. A jump to action $S_i$ is then performed and processing within action $S_i$ proceeds based on the information in register bx as shown in blocks 74, 78.

The actions associated with symbol alignments such as that represented by symbol alignment diagram 300 are called split actions. These split actions are indicated as $S_1, S_2, \ldots 18$ within fast statistical decoding method 10 of the present invention. The value of action number i of split action $S_i$ indicates the number of free bits x which must be extracted from next byte 312 and added to the base value obtained from the data table in accordance with current byte 310. The table lookup and jump are based on this value as shown in lookup block 74. Therefore, the value of i also indicates which state should be entered next by the state machine. This state is $B_{i \bmod 8}$. The table lookup and jump are based on this value as shown in lookup block 74. Therefore, the code for an action $S_i$ may be represented as:

---

$S_i$:

Get new byte from bit stream into dx
Extract i bits from dx, add to base value in bx
bx = IndexToValue(the above sum)
[do whatever additional processing is required, using the decoded value in bx]
Do the table lookup and indirect JMP again, using the tables for state $B_{i \bmod 8}$.

---

In the symbol alignment represented by Huffman symbol alignment diagram 400, part of the symbol prefix of the next code word is outside current byte 410 having byte boundaries 402, 404. The remainder of the prefix is contained within next byte 412 having byte boundaries 404, 406. When alignment decision 18 determines that this alignment is present execution of fast statistical decoding method 10 proceeds from alignment decision 18 by way of path 90. Following byte 514 is then fetched and stored in register dx as shown in block 96.

In order to handle the type of symbol alignment shown in symbol alignment diagram 400 statistical decoding method 10 provides additional states in the state machine. One such additional state is provided for each unique partial symbol prefix which may be formed by splitting the symbol prefix between current byte 410 and next byte 412 by byte boundary 404.

In order to determine the total set of partial prefixes possible for this type of alignment between a Huffman symbol in table $T_i$ and byte boundaries in a compressed bit stream all possible binary strings which may be valid symbol prefixes are determined. The substrings formed by the first i bits of each valid prefix thus determined are then determined to be the valid partial prefixes. It will be understood that i in this context may vary from 1 to P(k)−1. The set of all unique substrings determined in this manner is the set of partial symbol prefixes.

Thus, if there are m partial symbol prefixes, m additional states are added to the state machine in fast statistical decoding method 10. These m additional states, or m additional actions, are indicated as $P_0, P_1, \ldots P_{m-1}$. When partial prefixes $P_i$ are encountered m more actions, $P_i$, are added. Actions $P_i$ perform the following operations:

---

$P_i$:

get new byte from bit stream dx
do the table lookup and indirect JMP again, using the tables for state $P_i$

---

Once in a prefix state, $P_i$, the next action is always a $C_i$ action or an $S_i$ action. This follows from the restrictions of Equation (1) and Equation (2) which are imposed upon the Huffman code book in statistical decoding method 10. The determination whether to perform a $C_i$ action or an $S_i$ action at this point is made at decision 98 and execution proceeds by way of path 22 or path 50 accordingly.

Because $P(k) \leq 8$ and $F(k) \leq 8$ the worst case symbol alignment which may occur in a compressed bit stream being decoded by statistical decoding method 10 is represented by Huffman symbol alignment diagram 500. The symbol having the alignment of Huffman symbol alignment diagram 500 has the maximum allowed symbol prefix length of eight bits. This is indicated by the eight P's divided between current byte 510 and next byte 512 by byte boundary 504 within symbol alignment diagram 500. The Huffman symbol of alignment diagram 500 also has a free bit length of eight bits as indicated by the eight x's divided between next byte 512 and following byte 514 by byte boundary 506. Symbols having the alignment of symbol alignment diagram 500 are the most difficult to decode within fast statistical decoding method 10.

In the symbol alignment of alignment diagram 500 the prefix of the symbol to be decoded starts at bit seven of current byte 510 as indicated by bit-aligned pointer 502. This results in there being only a single bit of the symbol prefix in current byte 510 and seven prefix bits in next byte 512. However, even in this worst case the symbol prefix must end in next byte 512 because of the restriction of Equation (1). Therefore a second $P_i$ action is not required and all free bits x must fit within following byte 514. It will be understood that all free bits x must fit in following byte 514 because of the restriction of Equation (2). Thus an $S_i$ action is always sufficient at this point to determine the statistical symbol having the alignment of diagram 500. It will be understood however that an $S_i$ action may not always required. If the free bits of the Huffman symbol end in next byte 512, only a $C_i$ action is required and no fetch of following byte 514 is required.

The application of statistical decoding method 10 wherein a Huffman symbol is aligned as in alignment diagram 400 may be summarized as follows. By imposing the restrictions on the Huffman symbols that P(k) must be less than or equal to eight and that F(k) must be less than or equal to eight, every code word in the Huffman code book may be completely decoded by either a $C_i$ action, an $S_i$ action, or a $P_i$ action followed by either a $C_i$ action or an $S_i$ action. This illustrates the assertion that the $B_i$ and $P_i$ states are sufficient to decode all possible codes in all possible bit alignments using fast statistical decoding method 10.

With the addition of the further $P_i$ states for symbols having the alignment of diagram 500 within statistical decoding method 10 there are m+8 states in the state machine. Each of these m+8 states requires a jump table of two hundred and fifty-six entries wherein each jump table requires a memory of five hundred and twelve bits. Each state of the state machine also requires a two hundred and fifty-six byte data table for a total of a ¾*(8+m) kilobyte memory requirement for storing data tables. For example, the unique partial prefixes of a conventional Huffman code book may be indicated as shown in Table III.

TABLE III 1
11
111
1111
11111
111111
1111111

In this case, the number of additional states m has a value of seven. This results in a total of fifteen states in the state machine when these seven additional states are added to the original eight states. Thus it may be calculated that there is a requirement for eleven kilobytes of memory for storing tables in the example of Table III. For another conventional code book (not shown), m may have a value of twelve. In this case, there would be a total of twenty states and hence fifteen kilobytes of memory space would be required for storing tables. In many cases the memory required for storing these tables is a very good tradeoff for achieving the greatly increased execution speed.

A determination may now be made of the amount of code space required for statistical decoding method 10. Space is required for each of the eight $C_i$ actions, for each of the $S_i$ actions for the split code case, and for each of the m actions which are designated $P_i$ within statistical decoding method 10. First a determination may be made of the number s of $S_i$ actions. The number s of $S_i$ actions may be expressed as:

$$s = \max(F(k)).$$ Equation (3)

Thus, it will be understood that the maximum must always be less than eight because of the restriction placed upon F(k) as set forth in Equation (2). Typically, each of the code fragments is, or can be arranged to be, relatively small. The code space requirements for fast statistical decoding method 10 are thus quite reasonable. Usually the space required for the codes is much less than the space required for the data tables in statistical decoding method 10.

In addition to the offline computed values and jump tables, other things which must be coded include the $C_i$, $S_i$, and $P_i$ actions. Pseudocode implementations of these three types of actions are shown in Table IV. In the pseudocode of Table IV, DoStuff represents other work that must be performed to decode bit stream $S_i$ in addition to obtaining the Huffman decoded value $V_i$ using statistical encoding method 10. In order to estimate the cost of the Huffman decoding by decoding method 10 above it is assumed that the execution of DoStuff requires zero instruction cycles.

TABLE IV $\underline{C_i:}$

DoStuff
GetNewByte [for $C_0$ action only]
NextAction $\underline{S_i:}$

GetNewByte
CalculateValue
DoStuff
NextAction $\underline{P_i:}$

GetNewByte
NextAction

Table V sets forth three more macro instructions referred to in Table IV. These may be useful for implementing fast Huffman decoding method 10 in particular video processing systems. These three macros instructions are GetNewByte, CalculateValue and NextAction. In these macro instructions ds:bp points to the compressed bit stream, dx holds the current byte from the compressed bit stream being decoded, and bx holds the decoded value $V_i$ of each symbol.

TABLE V

```
GetNewByte:
    mov dl,    ds[bp]
    inc bp
```

TABLE V-continued

```
CalculateValue:
    mov cl,    BitExtractTableI[edx]
    mov bl,    IndexToValue[ebx + ecx]
NextAction:
    mov bl,    StateIDataTable[edx]
    jmp        StateIJumpTable[edx*2]
```

In the pseudo code representation of Table V, the value of I in BitExtractTableI, StateIDataTable, and StateIJumpTable, may be hardcoded to be the same value as i in the action subscript of actions $C_i$, $S_i$ and $P_i$. The tables referred to as BitExtractTable are s additional tables of two hundred and fifty-six bytes each. They may be used to extract some number of bits from the beginning of a byte. For example, they may be used to extract the remaining free bits of next byte 312 of symbol alignment diagram 300. This type of bit extraction is preferred to shifting next byte 312 because it is much faster. Thus the total table space required by fast statistical decoding method 10 of the present invention is:

$$\text{Total table space} = (¾*(8+m)+s/4)K \text{ bytes} \quad \text{Equation (4)}$$

Most Huffman symbols are short by the nature of Huffman encoding. Therefore in most cases the entire Huffman symbol fits within a current byte such as current byte 208 of Huffman symbol alignment diagram 200. In the type of case represented by symbol alignment diagram 200 a single $C_i$ action is sufficient to obtain the decoded value $V_i$ and store it in register bx for further processing. This requires only two instructions in a conventional processor, one MOV instruction and one JMP instruction. Some symbols may require $S_i$ or $P_i$ actions as shown in symbol alignment diagrams 300, 400. However these symbols only add a few additional instructions beyond those required for the $C_i$ actions.

It should be emphasized that the decoded values provided by fast statistical decoding method 10 are the actual $V_i$ values and not merely indices $I_i$ for obtaining decoded values $V_i$. In the case of a $C_i$ action, the IndexToValue translation of Table V may be performed off line and the resulting values stored directly in StateIDataTable. This is one way in which $C_i$ actions are more optimized than $S_i$ actions. In many conventional processors the decoded values $V_i$ are non-trivial permutations of the indices $I_i$. Thus the ability to do IndexToValue substantially free for many code words is a significant advantage in statistical decoding method 10.

It is useful to determine a statistical average of the number of instructions that are required to decode each symbol for a selected Huffman code book within statistical decoding method 10. To make this determination, it should be noted that there are only four types of actions which have different execution times statistical within decoding method 10. These four types of actions are: (1) $C_0$, (2) $C_i$ wherein i is greater than 0, (3) $S_i$, and (4) $P_i$.

The reason that the execution time for $C_0$ is different from the execution times of the remaining $C_i$ actions is that the time required for $C_0$ includes the additional time required for an extra GetNewByte function to be performed as shown in Table V. This extra GetNewByte function is required because $C_0$ by definition indicates that the Huffman symbol barely fits within current byte 208 of symbol alignment diagram 200. Thus after the decoding of current byte 208 bit-aligned pointer 206 is located at bit zero of next byte 210. This requires a fetch of next byte 210 as a part of the current action.

The number of instructions, or cycles, required for each of these four cases ($C_0$, $C_i$, $S_i$, $P_i$) may be indicated by the notation $I_0$, $I_C$, $I_S$ and $I_P$. The principal theorem is that for a code table $T_i$, described by the P(k) and F(k) of each row R, the average number of instructions needed to decode a Huffman symbol using statistical decoding method 10 of the present invention is approximately:

$$I \approx \frac{1}{8} \sum_k \frac{1}{2^{P(k)}} \left[ I_C(7 - F(k)) + I_o + I_s F(k) + I_p(P(k) - 1) \right]. \quad \text{Equation (5)}$$

In order to prove Equation (5), it may be assumed for simplicity that statistical decoding method 10 operates upon a large compressed bit stream containing a random concatenation of code words with the proper statistical probability. Since the bit stream S is large it may be assumed that the codes in each row R of the code table $T_i$ are uniformly distributed over all eight possible bit alignments, where the end of the code occurs at bit position i in a byte.

Equation (5) permits determining the average number of actions of each of the four types which contributed to each row R of code table $T_i$. Thus, for each row R, and for each of the eight possible alignments, a determination may be made how many actions of each type, $C_0$, $C_i$(i>0), $S_i$, and $P_i$ have occurred. In making this determination it is clear that only one $C_0$ action may occur. This $C_0$ action corresponds to the case where the end of the code is at bit seven.

Additionally, it is known that the number s of $S_i$ actions is F(k) because there are F(k) different ways in which a code can have a byte boundary occur within the series of free bits x. Three of the eight possible alignments $C_o$, $C_i$ and $S_i$ actions are mutually exclusive. The total number of $C_0$, $C_i$ and $S_i$ actions is eight. Thus the number of $C_i$ actions is eight, reduced by one for the $C_0$ action and reduced by F(k) for the $S_i$ as follows: 8−1−F(k)=7−F(k). Finally, the number of $P_i$ actions is simply P(k)−1 because this is the number of partial symbol prefixes in the row. Summing up these four enumerations and multiplying by the instruction counts ($I_0$, $I_c$, $I_s$, and $I_p$), provides the bracketed term of Equation (5).

The factor of one-eighth is applied within Equation (5) because of the factor of eight applied due to counting all eight bit positions. The factor of $½^{P(k)}$ is applied within Equation (5) because of the property of Huffman codes wherein the probability of the occurrence of a single symbol that is n bits long is approximately $½^n$. This indicates that the probability of occurrence of a single code in a row R is $½^{P(k)+F(k)}$. Because there are $2^{F(k)}$ codes in a row, counting all possible values for the free bits, the total probability of occurrence of all the codes in row R is $2^{F(k)}/2^{P(k)+F(k)}=½^{P(k)}$.

In order to measure the performance of Huffman statistical decoding method 10 on conventional processors, the formula of Equation (5) was applied twice and the number of MOV and JMP instructions in the four actions was separately counted. The MOV+INC instructions in the Get-NewByte function are counted as a single MOV because it may actually be done that way and because an INC is very fast. With this simplification, the number of MOV and JMP instructions for each of the for actions types are set forth in Table VI.

TABLE VI

| Action | $C_0$ | $C_i$ | $S_i$ | $P_i$ |
|--------|-------|-------|-------|-------|
| #MOV   | 2     | 1     | 4     | 2     |
| #JMP   | 1     | 1     | 1     | 1     |

Applying the theorem to these numbers for two common algorithms running on a twenty-five megahertz processor and a thirty-three megahertz processor gives the results shown in Table VII:

TABLE VII

| Avg #MOV | Avg #JMP | Cycles of 25 MHz Proc | Cycles of 33 MHz Proc |
|---|---|---|---|
| 2.3 | 1.1 | ≅20 | ≅8 |
| 2.1 | 1.2 | ≅20 | ≅8 |

Most Huffman distributions appear to give similar results. The method of the present invention is not very sensitive to the exact statistics of the code words. At three hundred kilosymbols per second for thirty frame per second compressed video, these results indicate that about twenty-four percent of the twenty-five megahertz processor may be used by statistical decoding method 10 and about seven percent of the thirty-three megahertz processor.

Optimization of statistical decoding method 10 of the present invention may be used to speed up the overall execution of a decompression algorithm that incorporates decoding method 10. One optimization which may be performed is an optimization of special $C_i$ actions. In many algorithms certain Huffman decoded values have special meanings. For example, in one prior art algorithm sixteen of the values represent run length encoded zeros which are decoded a different way from the other values. In another prior art algorithm there are two special values, one indicating end of block and another indicating escape.

An advantageous way to implement these special values is to have code in the DoStuff part of each action that says:

```
if (value is special)
    do the appropriate thing
else
    do the ordinary thing
```

If an $S_i$ action is being executed within statistical decoding algorithm 10 it must be implemented this way because value is not known until it is calculated. However, for $C_i$ actions value is implicitly known during off line computation of the jump tables. So it is possible to optimize this by providing special labels in the jump tables for these cases. These special labels may be adapted to cause a jump to special fragments of code that perform only the work necessary for the special actions. These special fragments are separate from the C, S, and P code fragments. Since most codes are decoded by the $C_i$ actions, the savings from avoiding the IF tests are significant, especially if special actions are common.

For every special action optimized in this manner there are eight code fragments, one for each of the eight possible bit alignments or, equivalently, for each of the eight possible states. Also note that it is possible to pass a single parameter to these special code fragments or routines through the State Data Table. This may be used, for example, to pass the run length parameter required for run length decoding in real time video applications.

Another optimization is a further type of action which may be indicated as an E action wherein E actions are understood to be actions performed in response to errors. An E is based on the fact that for most Huffman code books there are certain bit sequences which cannot occur at the beginning of a code word, except in the case in which the code book is closed. An example of a code book with a bit sequence which cannot occur is a prior art code book wherein no valid code word begins with a sequence of eight ones.

When computing the jump tables for statistical decoding method 10 it is possible to provide a special E action in all locations which may correspond to illegal code words. This is convenient for two reasons. (1) It provides automatic recognition of invalid code words which might occur if there is an uncorrected data transmission error in a compressed bit stream being decoded. This recognition may be used to abort decoding when the error is detected. (2) It may sometimes be used to speed up decoding by permitting automatic detection of the end of a compressed bit stream, rather than using an explicit counter inside the DoStuff processing. Before decoding is begun, an illegal code word may be inserted just past the end of the bit stream. This causes the state machine of the present invention to jump to the E action when decoding is complete with a zero instruction overhead.

Furthermore, during the design of a compressed bit stream error codes may be designated as delimiters. For example, an error code may be inserted between different sections of data requiring different processing to permit detection of the end of each section for free.

I claim:

1. A method for statistical decoding of a variable bit length symbol in a data stream divided into a plurality of bytes having byte boundaries to provide an output value, said symbol having an alignment with respect to said byte boundaries, comprising the steps of:

(a) fetching a first byte of data from said data stream, said first byte of data containing at least a portion of said symbol;

(b) determining said alignment of said at least a portion within said first byte with respect to a byte boundary of said first byte;

(c) fetching a second byte of data in accordance with said determined alignment;

(d) extracting a determined number of bits from said second byte of data, wherein said determined number of bits is determined in accordance with said first byte of data; and (e) determining said decoded value in accordance with said fetched data.

2. The method for the statistical decoding of a symbol of claim 1, wherein step (e) comprises performing a table lookup.

3. The method for the statistical decoding of a symbol of claim 1, comprising the step of forming an index according to said first byte of data and said extracted bits.

4. The method for the statistical decoding of a symbol of claim 3, wherein step (e) comprises determining said decoded value according to said index.

5. A method for statistical decoding of a variable bit length symbol in a data stream divided into a plurality of bytes having byte boundaries to provide an output value, said symbol having an alignment with respect to said byte boundaries, wherein there is provided a plurality of symbols and a plurality of action routines corresponding to said plurality of symbols, comprising the steps of:

(a) fetching a first byte of data from said data stream, said first byte of data containing at least a portion of said symbol;

(b) determining said alignment of said at least a portion within said first byte with respect to a byte boundary of said first byte;

(c) fetching a second byte of data in accordance with said determined alignment;

(d) determining said decoded value in accordance with said fetched data; and (e) executing a selected action routine of said plurality of action routines in accordance with said decoded value.

6. A method for statistical decoding of a variable bit length symbol in a data stream divided into a plurality of bytes having byte boundaries to provide an output value, said symbol having an alignment with respect to said byte boundaries, wherein there is provided a plurality of variable length symbols including a prefix and free bits, comprising the steps of:

(a) fetch a first byte of data from said stream, said first byte of data containing at least a portion of said;

(b) determining said alignment of said at least a potion within said byte with respect to a byte boundary of said first byte;

(c) fetching a second byte of data in accordance with said determined alignment;

(d) determining said decoded value in accordance with said fetched data, wherein step (b) comprises the steps of:

(e) determining whether both said prefix and said free bits fall within said first byte;

(f) determining whether a byte boundary of said first byte falls within said free bits; and (g) determining whether a byte boundary of said first byte fall within said prefix.

7. The method for statistical decoding of a symbol of claim 6, wherein both prefix and free bits fall within said first byte and the decoded value is determined only in accordance with said first byte of data.

8. The method for the statistical decoding of a symbol of claim 6, wherein a byte boundary of said first byte falls within said free bits, further comprising the step of extracting a number of free bits from said second byte of data, the number of free bits being determined in accordance with the data of said first byte of data.

9. The method for the statistical decoding of a symbol of claim 6, wherein a byte boundary of said first byte falls within said prefix, further comprising the step of determining whether to fetch a third byte of data in accordance said first byte of data.

* * * * *

UNITED STATES PATENT AND TRADEMARK OFFICE
CERTIFICATE OF CORRECTION

PATENT NO. : 5,615,020
DATED : March 25, 1997
INVENTOR(S) : Michael Keith

It is certified that error appears in the above-indentified patent and that said Letters Patent is hereby corrected as shown below:

Column 13, line 8, delete "fetch" and insert therefor --fetching--.

Column 13, line 9, insert "symbol" after the word said.

Column 13, line 10, delete "potion" and insert therefor --portion--.

Column 14, line 2, delete "fall" and insert therefor --falls--.

Signed and Sealed this

Sixteenth Day of September, 1997

*Attest:*

BRUCE LEHMAN

*Attesting Officer*  Commissioner of Patents and Trademarks